(12) United States Patent
Lin

(10) Patent No.: US 6,866,967 B2
(45) Date of Patent: Mar. 15, 2005

(54) STRUCTURE OF PHASE SHIFTING MASK

(75) Inventor: Benjamin Szu-Min Lin, Hsin-Chu (TW)

(73) Assignee: United Microelectronics Corp., Hsin-Chu (TW)

(*) Notice: Subject to any disclaimer, the term of this patent is extended or adjusted under 35 U.S.C. 154(b) by 0 days.

(21) Appl. No.: 10/190,197

(22) Filed: Jul. 3, 2002

(65) Prior Publication Data
US 2004/0005505 A1 Jan. 8, 2004

(51) Int. Cl.$^7$ ................................................. G03F 9/00
(52) U.S. Cl. ............................................................ 430/5
(58) Field of Search .............................. 430/5, 322, 323, 430/324

(56) References Cited

U.S. PATENT DOCUMENTS 5,330,862 A * 7/1994 Tabuchi et al. ................ 430/5
6,096,457 A * 8/2000 Pierrat ........................... 430/5

* cited by examiner

Primary Examiner—S. Rosasco
(74) Attorney, Agent, or Firm—Merchant & Gould P.C.

(57) ABSTRACT

A phase shifting mask is disclosed in this present invention. The above-mentioned phase shifting mask comprises a quartz layer and a plurality of transmission adjustor layer onto the quartz layer. By employing the above-mentioned phase shifting mask, the material of the transmission adjustors has not to be changed with the light source. Furthermore, the contrast of the phase shifting mask of this invention is better than the contrast of the binary mask and the half-tone mask in the prior art. Therefore, this invention provides a more efficient mask, and the phase shifting mask according to this present invention can improve the resolution in photolithography.

25 Claims, 5 Drawing Sheets

STRUCTURE OF PHASE SHIFTING MASK

BACKGROUND OF THE INVENTION

1. Field of the Invention

This present invention relates to a structure of phase shifting mask. More particularly, this present invention relates to a structure of chrome phase shifting mask.

2. Description of the Prior Art

Photolithography plays a very important role in semiconductor manufacture, and mask is the most important element in photolithography. In the prior art, a well-known mask is the binary intensity mask (BIM). Referred to FIG. 1A, a binary intensity mask comprises a quartz layer 100 and a plurality of chrome areas 110 onto the quartz layer 100. Light is obstructed by the chrome areas 110. Thus, the transmission of the chrome areas 110 is 0%, and the transmission of the non-chrome areas of the quartz layer 100 is 100%. The E-field strength plot of light through the binary intensity mask is shown in FIG. 1B, and the intensity plot of a light on a wafer through the above-mentioned binary intensity mask is depicted in FIG. 1C.

Another well-known technology is phase shifting mask. Phase shifting mask is widely used for advanced photolithography. FIG. 2A is a half-tone phase shifting mask. The above-cited phase shifting mask comprises a quartz layer 200, and a plurality of shifter 210. The phase difference between the quartz layer 200 and the shifters 210 may be 90°, 180°, or 270°. The transmission of the shifters 210 is 3% to 20%, and the transmission of the quartz layer 200 without the shifters 210 is 100%. FIG. 2B depicts an E-field strength plot of light through the phase shifting mask. FIG. 2C depicts an intensity plot of a light on a wafer through the mask.

With the decreasing of the line width tolerance, the phase shifting mask is more and more important for controlling the line width. However, the materials of the phase shifting mask in the prior art may not be suitable for different wavelength light sources to develop due to the materials including different absorptions of different wavelengths. Thus the new shifter materials should always be found out for a new photolithography generation. When the wavelength of the light of the light source is different, it is difficult and complex for finding out a suitable shifter material for achieving the different phase requirement and the transmission requirement.

Hence, for improving the efficiency in photolithography, it is an important object to develop a phase shifting mask without changing the shifter materials while changing the light source, and achieving different transmission and phase difference requirement.

SUMMARY OF THE INVENTION

In accordance with the present invention, a phase shifting mask is provided for improving the efficiency of photolithography. While the light source is changed, it is not necessary to change the materials of the phase shifting mask according to this invention.

It is another object of this invention to achieve the phase difference requirement of semiconductor manufacture by utilizing a phase shifting mask according to this invention.

It is still another object of this present invention to achieve the different transmission requirement of semiconductor manufacture, that is, the transmission of the phase shifting mask can be modified by the transmission adjustors of the phase shifting mask according to this prevent invention.

It is still another object of this present invention to achieve the better resolution of photolithography by raising the contrast of the phase shifting mask according to this prevent invention.

In accordance with the above-mentioned objects, the invention provides a structure of a phase shifting mask. The phase shifting mask of this present invention comprises a quartz layer and a plurality transmission adjustors on a the quartz layer. The transmission of the transmission adjustors can be modified to achieve the transmission requirement of a semiconductor manufacture. The phase shifting mask according to this invention is not necessary to change the materials of the phase shifting mask while the wavelength of the light of the light source being different. Furthermore, the contrast of the above-mentioned phase shifting mask is better than the contrast of the binary intensity mask and the contrast of the half-tone phase shifting mask in the prior art. Therefore, this present invention provides a more efficient phase shifting mask, to increase the resolution of the photolithography.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENTS

Some sample embodiments of the invention will now be described in greater detail. Nevertheless, it should be recognized that the present invention can be practiced in a wide range of other embodiments besides those explicitly described, and the scope of the present invention is expressly not limited except as specified in the accompanying claims.

Then, the components of the semiconductor devices are not shown to scale. Some dimensions are exaggerated to the related components to provide a more clear description and comprehension of the present invention.

One preferred embodiment of this invention is a structure of chrome phase shifting mask. The above chrome phase shifting mask comprises a substrate, and a plurality of transmission adjustors onto the substrate. The substrate may be a quartz layer. The quartz layer comprises a plurality of convex regions and a plurality of concave regions. The above-mentioned transmission adjustors are formed onto the convex regions, and include chrome. Each of the transmission adjustors comprises a plurality of transparent regions. The transparent regions may be non-Cr areas. The non-Cr areas may be formed in squares, lines, circles, or other geometric figures.

At the concave regions of the quartz layer, the etched depth of the quartz layer is utilized for adjusting the phase difference of the mask according to this embodiment. Across the quartz layer, the phase difference between the concave region and the convex region may be 90°, 180°, or 270°. The transmission of the transmission adjustors onto the quartz layer is changed by adjusting the spacing and the pattern of the non-Cr areas. The transmission of the transmission adjustors may be 3% to 20%. In this manner, when the difference wavelength light source is employed in photolithography, the material of the transmission adjustors is not necessary to be changed. Hence, the mask according to this embodiment can achieve difference transmission and phase difference requirement. Furthermore, the phase mask according to this embodiment can raise the resolution in photolithography by the contrast of the phase shifting mask.

Figure 1A:
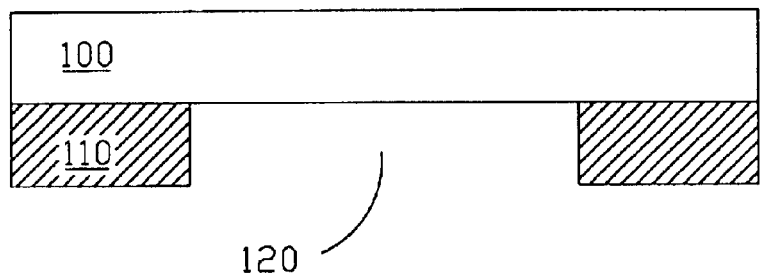
FIG. 1A is a diagram showing a binary intensity mask in the prior art.
Figure 1B:
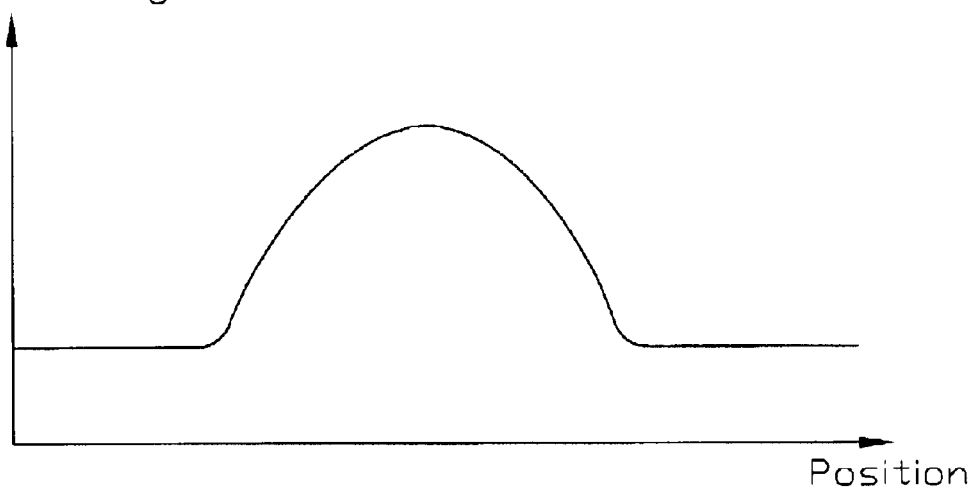
FIG. 1B depicts an E-field strength plot of light through the mask in FIG. 1A.
Figure 1C:
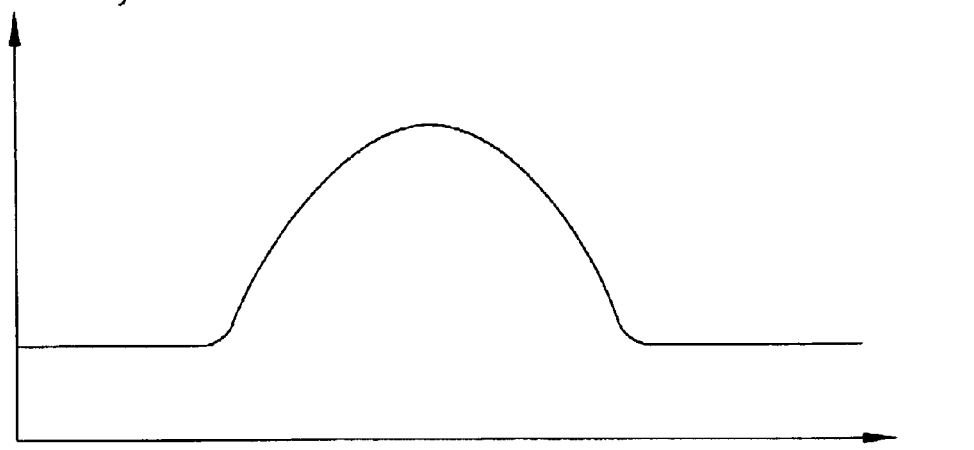
FIG. 1C depicts an intensity plot of a light on a wafer through the mask in FIG. 1A.
Figure 2A:
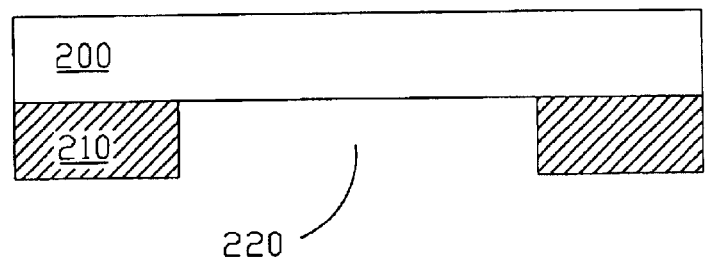
FIG. 2A is a diagram showing a half-tone phase shifting mask in the prior art.
Figure 2B:
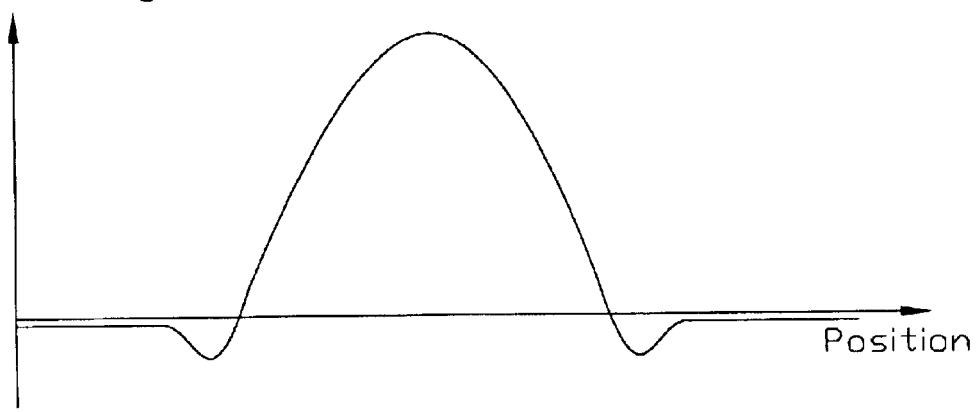
FIG. 2B depicts an E-field strength plot of light through the mask in FIG. 2A.
Figure 2C:
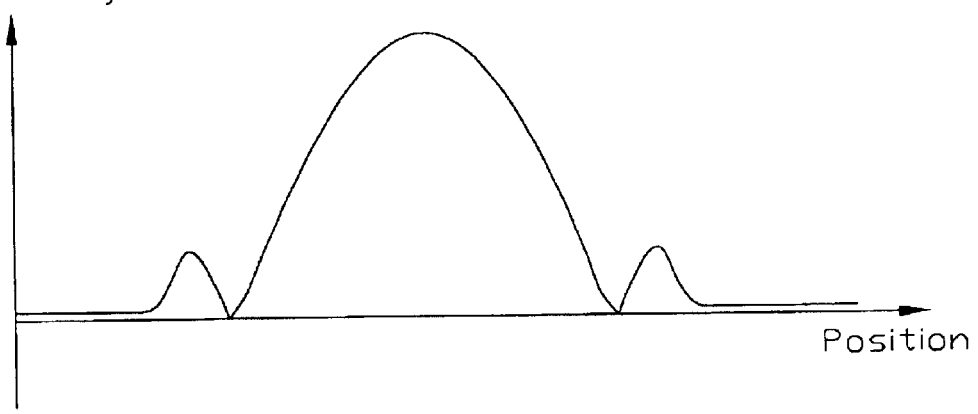
FIG. 2C depicts an intensity plot of a light on a wafer through the mask in FIG. 2A.
Figure 3A:
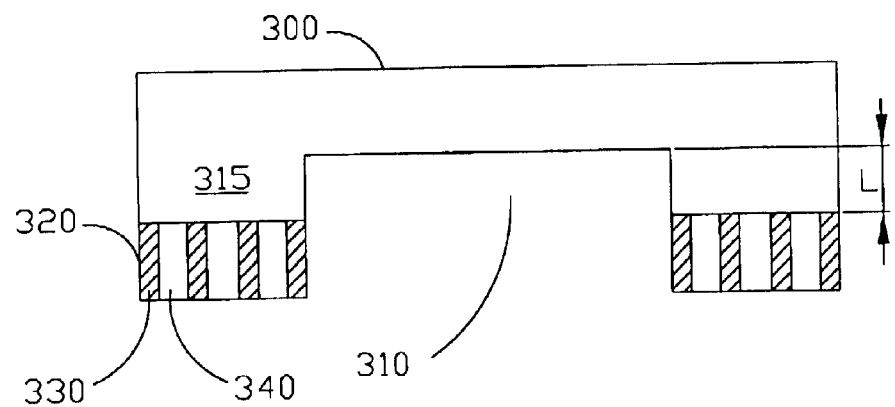
FIG. 3A is a diagram showing a half-tone phase shifting mask according to this present invention.

Another preferred embodiment of this present invention is a structure of a phase shifting mask. Referred to FIG. 3A, the above-mentioned phase shifting mask comprises a quartz layer 300, and a plurality of transmission adjustor 320 onto the quartz layer 300. The quartz layer 300 comprises a plurality of concave region 310 and convex region 315. The depth L of the concave regions 310 is employed to adjust the phase difference between the concave regions 310 and the convex regions 315. In other words, the phase difference between the concave region 310 and the convex region 315 may be 90°, 180°, or 270° by changing the depth L.

Each of the transmission adjustors comprises a plurality of block regions 330 and a plurality of transparent regions 340. In this present embodiment, the block regions 330 include chrome, and the transparent regions 340 are non-chrome areas. The transmissions of the transmission adjustors 320 are modified by changing the spacing and pattern of the transparent regions 340. The transmissions of the transmission adjustors 320 may be from 1% to 30%. Preferably, the transmissions of the transmission adjustors 320 may be from 3% to 20%.

The light source employed in this present embodiment may be I-line laser, KrF laser, ArF laser, or other light source possible utilized in lithography. In the prior art, because the shifter materials of the phase shifter mask may not suitable for difference wavelengths due to different wavelength-dependent absorption, new shifter materials should always be found out from photolithography generation to generation. However, in this present embodiment, the material of the transmission adjustor 320 does not have to be changed while the light source changed. When the light source is changed, the spacing and pattern of the block regions 330 and the transparent regions 340 will be modified to achieve a suitable transmission of the transmission adjustors 320.

Figure 3B:
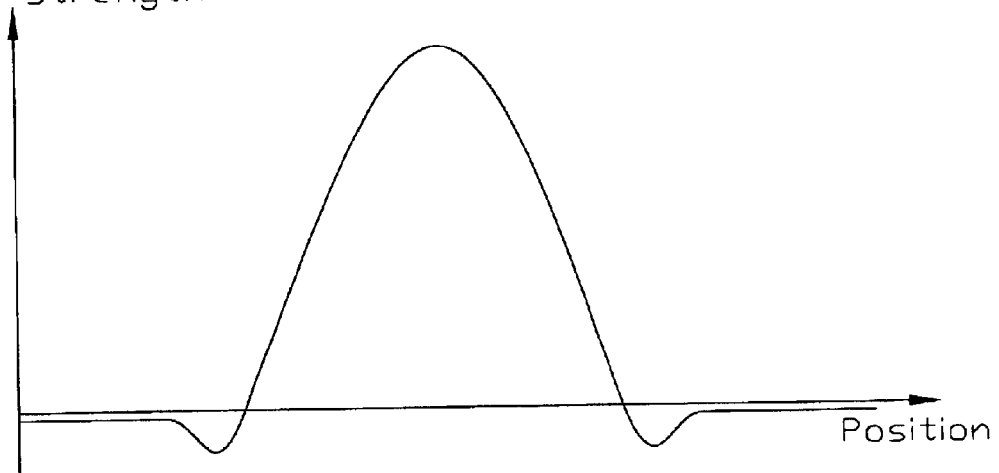
FIG. 3B depicts an E-field strength plot of light through the mask in FIG. 3A.
Figure 3C:
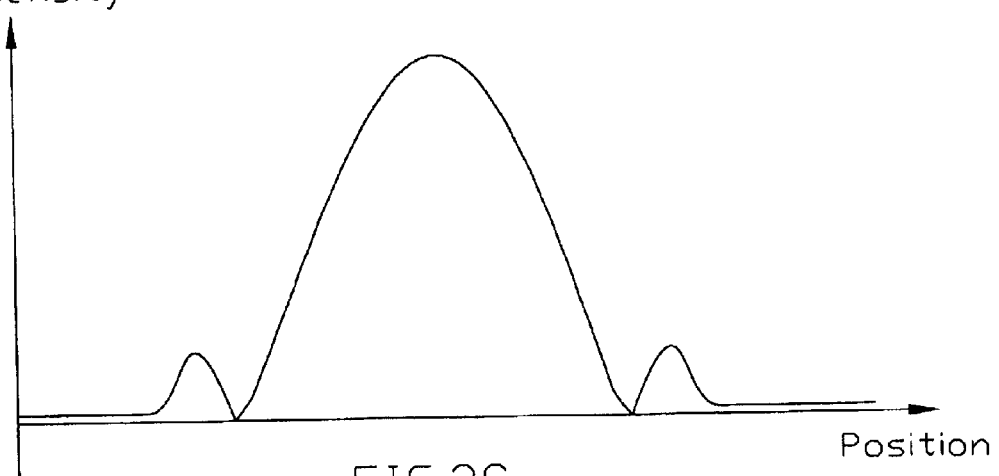
FIG. 3C depicts an intensity plot of a light on a wafer through the mask in FIG. 3A.

Moreover, the contrast of the phase shifting mask according to this embodiment is better than the contrast of the phase shifting mask and the binary mask in the prior art. FIG. 3B depicts an E-field strength plot of light through the mask according to this present embodiment. FIG. 3C depicts an intensity plot of a light on a wafer through the mask according to the present invention. As shown in FIG. 3B and FIG. 3C, this mask can cause node points (zero intensity), thereby increasing the image contrast to improve the resolution in photolithography. From one result of an examination, the contrast of the mask according to this present embodiment is 0.78. In the same examination, the contrast of the binary mask in the prior art is 0.63, and the contrast of the half-tone phase shifting mask in the prior art is 0.75. In other words, the resolution of the phase shifting mask according to this embodiment is better than the resolution of the binary mask and the half-tone phase shifting mask. Hence, in photolithography, the phase shifting mask can achieve batter resolution.

Figure 4A:
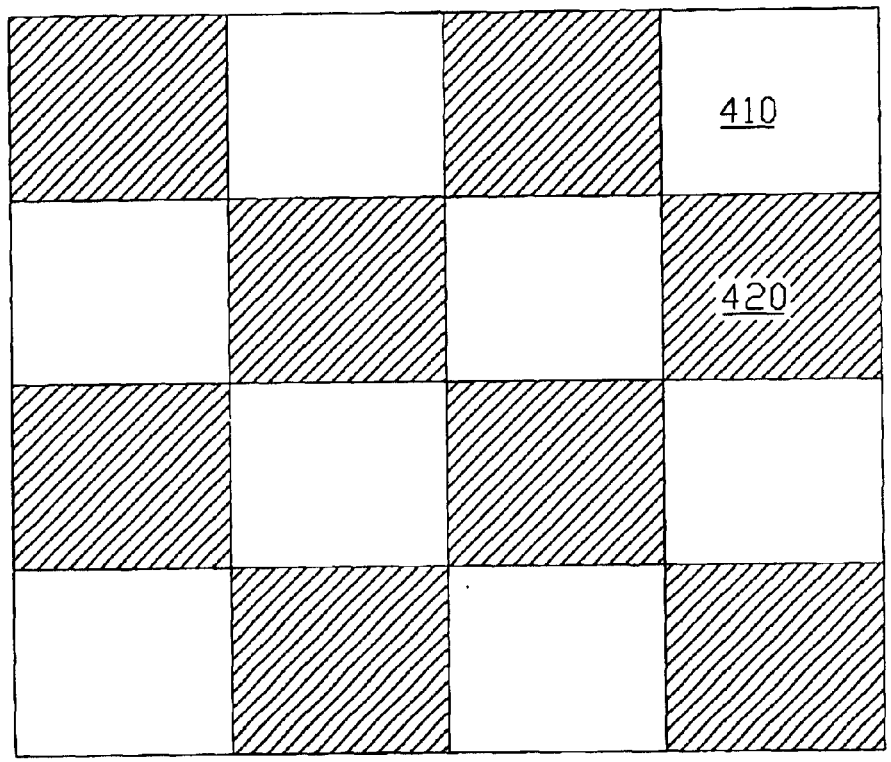
FIG. 4A is a top view of a transmission adjustor according to this presented invention.
Figure 4B:
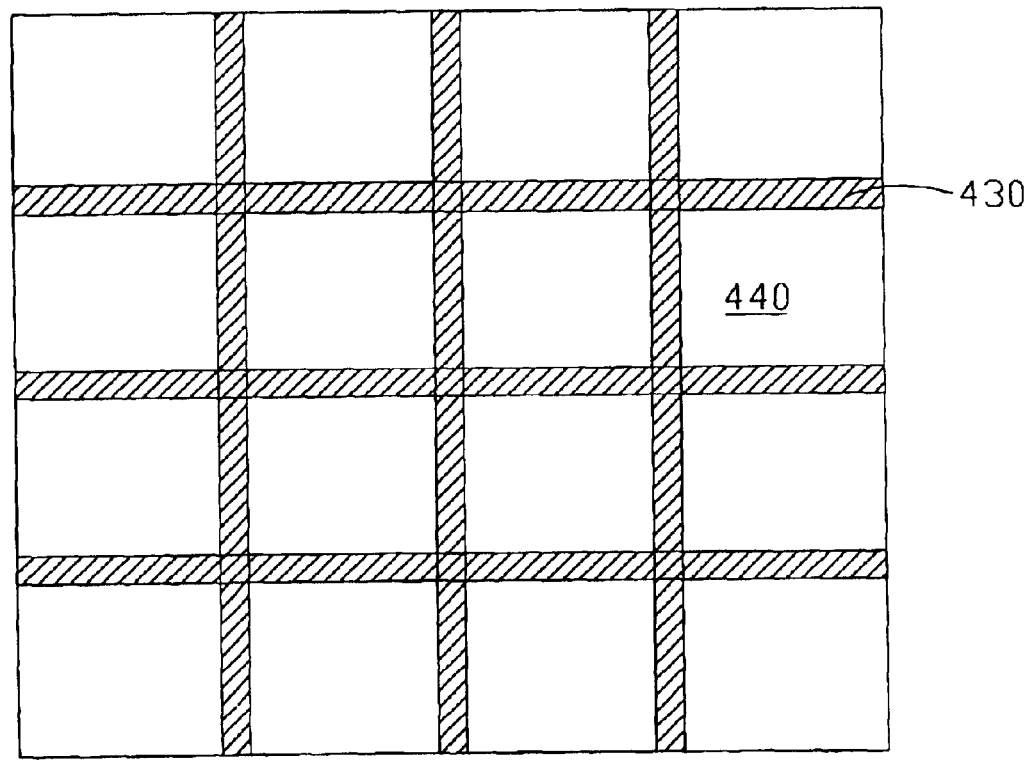
FIG. 4B is a top view of another transmission adjustor according to this presented invention.
Figure 4C:
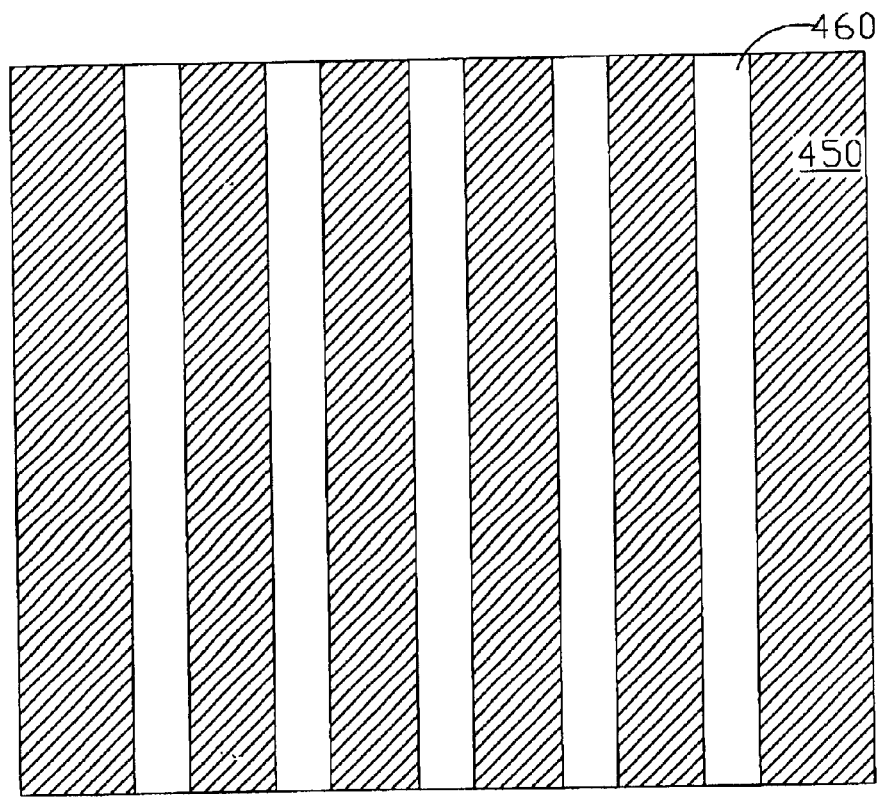
FIG. 4C is a top view of still another transmission adjustor according to this presented invention.
Figure 4D:
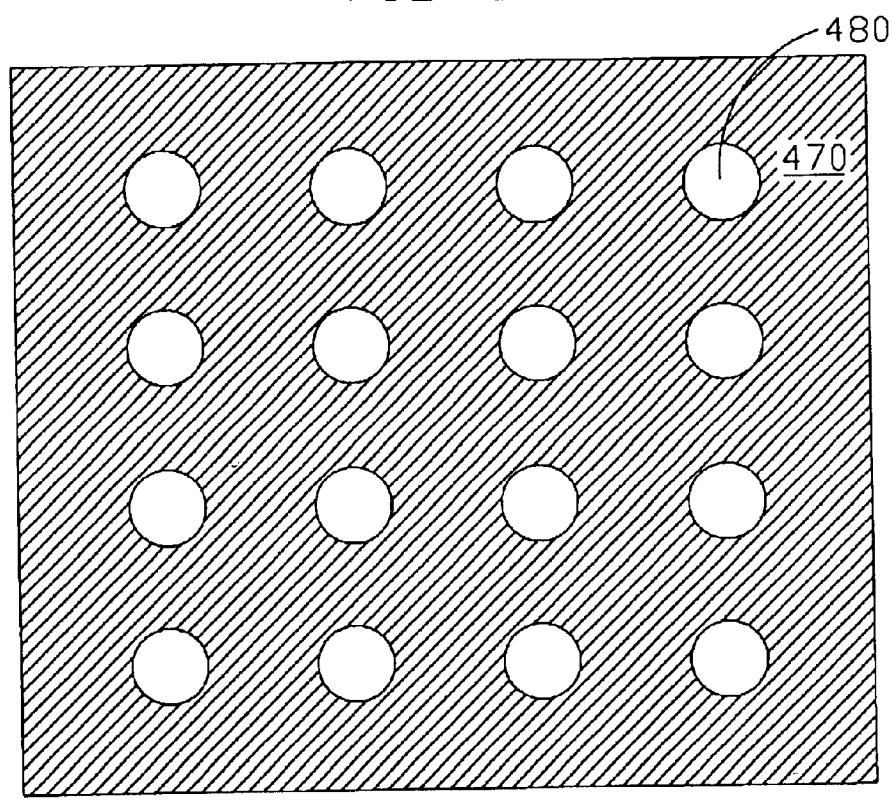
FIG. 4D is a top view of still another transmission adjustor according to this presented invention.

In the other hand, the pattern of the block regions 330 and transparent regions 340 of the transmission adjustors according to this embodiment may be formed in various geometric figures. For example, FIG. 4A is a top view of the transmission adjustor according to this embodiment. Referred to FIG. 4A, the pattern of the transmission adjustor may be formed as a chessboard, wherein the white squares 410 are the non-chrome areas and the black squares 420 is the block regions including chrome according to this embodiment. In another case, the pattern of the transmission adjustor may be formed as a screen as shown in FIG. 4B, wherein the black lines are the block regions and the white pieces are the transparent regions. In FIG. 4C, the block regions and the transparent regions are aligned as a plurality of line, wherein the black lines are the block regions and the white lines are the transparent regions. In still another case, the pattern of the transparent adjustor may be formed as FIG. 4D, wherein the black background is the above-mentioned block region and the white spots are the above-mentioned transparent regions. Besides, the pattern of the block regions and the transparent regions of the transmission adjustor also can be formed in other geometric figures. No matter the block regions and the transparent regions are formed in what kind of pattern, the transmission of the transmission adjustor still can be modified by changing the spacing between the block regions and the transparent regions of the transmission adjustor.

According to the preferred embodiment, this invention discloses a structure of phase shifting mask. The phase shifting mask according to this invention comprises a quartz layer with a plurality of concave region and a plurality of convex region, and a plurality of transmission adjustor onto the convex regions. The depth of the concave region is utilized to adjust the phase difference between the concave regions and the convex regions. In this invention, each of the transmission adjustors comprises a plurality of block region and transparent region for adjusting the transmission of the transmission adjustor. The transmission the transmission adjustors are modified from 3% to 20%, and the phase difference between the convex regions and the concave regions of the quartz layer are 90°, 180°, or 270°, depending on the depth of the concave regions of the quartz layer. According to this invention, the material of the transmission adjustors has not to be changed with the light source. Furthermore, according to the result of the examination, the contrast of the phase shifting mask of this invention is better than the contrast of the binary mask and the half-tone mask in the prior art. Thus, this invention provides a more efficient mask, and the phase shifting mask according to this present invention can improve the resolution in photolithography.

Although specific embodiments have been illustrated and described, it will be obvious to those skilled in the art that various modifications may be made without departing from what is intended to be limited solely by the appended claims.

What is claimed is:

1. A structure of a phase transfer mask, comprising:
   a substrate with a plurality of concave regions and a plurality of convex regions; and
   a plurality of transmission adjustors, onto said convex regions, wherein each of said transmission adjustors includes a plurality of transparent regions.

2. The structure according to claim 1, wherein said substrate is a quartz layer.

3. The structure according to claim 1, wherein said transmission adjustors comprise chrome.

4. The structure according to claim 1, wherein said transparent regions are non-chrome areas.

5. The structure according to claim 1, wherein a transmission of said transmission adjustors is from about 1% to 30%.

6. The structure according to claim 1, wherein a phase difference between said transmission adjustors and said concave regions is about 180°.

7. The structure according to claim 1, wherein said transparent regions are formed in geometric figures.

8. A structure of a phase shifting mask, comprising:
   a quartz layer with a plurality of concave regions and a plurality of convex regions; and
   a plurality of transmission adjustors onto said convex regions, wherein each of said transmission adjustors includes a plurality of block regions and a plurality of transparent regions.

9. The structure according to claim 8, wherein said block regions comprise chrome.

10. The structure according to claim 8, wherein said transparent regions are non-chrome areas.

11. The structure according to claim 8, wherein a transmission of said transmission adjustors is from about 3% to 20%.

12. The structure according to claim 8, wherein a phase difference between said transmission adjustors and said concave regions is about 90°.

13. The structure according to claim 8, wherein a phase difference between said transmission adjustors and said concave regions is about 180°.

14. The structure according to claim 8, wherein a phase difference between said transmission adjustors and said concave regions is about 270°.

15. The structure according to claim 8, wherein said transparent regions are formed in geometric figures.

16. The structure according to claim 8, wherein said transmission adjustors are arranged in as a screen pattern.

17. The structure according to claim 8, wherein said transmission adjustors are arranged in a chessboard pattern.

18. The structure according to claim 8, wherein said transmission adjustors are arranged in plurality of line pattern.

19. The structure according to claim 8, wherein said transmission adjustors are arranged in a circular pattern.

20. A structure of a phase shifting mask, comprising:
   a quartz layer with a plurality of concave regions and a plurality of convex regions; and
   a plurality of transmission adjustors onto said convex regions, wherein each of said transmission adjustors includes a plurality of chrome areas and a plurality of non-chrome areas.

21. The structure according to claim 20, wherein a transmission of said transmission adjustors is from about 3% to 20%.

22. The structure according to claim 20, wherein a phase difference between said transmission adjustors and said concave regions is about 180°.

23. The structure according to claim 20, wherein a phase difference between said transmission adjustors and said concave regions is about 90°.

24. The structure according to claim 20, wherein a phase difference between said transmission adjustors and said concave regions is about 270°.

25. The structure according to claim 20, wherein said chrome areas and said non-chrome areas are formed in geometric figures.

* * * * *